(12) United States Patent
Czech et al.

(10) Patent No.: US 7,368,390 B2
(45) Date of Patent: May 6, 2008

(54) PHOTOLITHOGRAPHIC PATTERNING PROCESS USING A CARBON HARD MASK LAYER OF DIAMOND-LIKE HARDNESS PRODUCED BY A PLASMA-ENHANCED DEPOSITION PROCESS

(75) Inventors: Guenther Czech, Langebrück (DE);
Carsten Fuelber, Dresden (DE);
Markus Kirchhoff, Ottendorf-Okrilla (DE); Maik Stegemann, Dresden (DE);
Mirko Vogt, Dresden (DE); Stephan Wege, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/494,063

(22) PCT Filed: Oct. 29, 2002

(86) PCT No.: PCT/DE02/04034

§ 371 (c)(1),
(2), (4) Date: Jan. 7, 2005

(87) PCT Pub. No.: WO03/038875

PCT Pub. Date: May 8, 2003

(65) Prior Publication Data

US 2005/0112506 A1    May 26, 2005

(30) Foreign Application Priority Data

Oct. 29, 2001   (DE) .............................. 101 53 310

(51) Int. Cl.
*H01L 21/311*   (2006.01)
(52) U.S. Cl. ............... 438/694; 438/700; 438/708; 438/709; 438/717; 438/724; 438/738; 257/E21.027; 257/E21.035

(58) Field of Classification Search ................ 438/99, 438/8, 9, 423, 700, 694, 708, 709, 717, 724, 438/738; 257/E21.027, E21.035
See application file for complete search history.

(56) References Cited

U.S. PATENT DOCUMENTS 5,234,793 A    8/1993    Sebald et al.

(Continued)

FOREIGN PATENT DOCUMENTS

DE    42 26 464 A1    8/1992

(Continued)

OTHER PUBLICATIONS

High Density Plasma Sources—Design, Physics and Performance Edited by: Popov, O.A. © 1995; William Andrew Publishing/Noyes, Chp. 6.4, p. 140.*

*Primary Examiner*—Michelle Estrada
*Assistant Examiner*—Jarrett J Stark
(74) *Attorney, Agent, or Firm*—Patterson & Sheridan, L.L.P.

(57) ABSTRACT

A carbon hard mask layer is applied to a substrate to be patterned by means of a plasma-enhanced deposition process in such a manner that it has a hardness comparable to that of diamond in at least one layer thickness section. During the production of this diamond-like layer thickness section, the parameters used in the deposition are set in such a manner that growth regions which are produced in a form other than diamond-like are removed again in situ by means of subsequent etching processes and that diamond-like regions which are formed are retained.

10 Claims, 3 Drawing Sheets

U.S. PATENT DOCUMENTS

| | | | |
|---|---|---|---|
| 5,340,696 A * | 8/1994 | Thackeray et al. | 430/270.1 |
| 5,378,316 A | 1/1995 | Franke et al. | |
| 5,656,128 A | 8/1997 | Hashimoto et al. | |
| 5,981,057 A * | 11/1999 | Collins | 428/334 |
| 5,981,398 A | 11/1999 | Tsai et al. | |
| 6,025,076 A * | 2/2000 | Collins | 428/408 |
| 6,030,541 A | 2/2000 | Adkisson et al. | |
| 6,091,081 A | 7/2000 | Matsubara et al. | |
| 6,153,327 A * | 11/2000 | Dearnaley et al. | 429/40 |
| 6,299,425 B1 * | 10/2001 | Hirano et al. | 418/63 |
| 6,316,329 B1 * | 11/2001 | Hirota et al. | 438/424 |
| 6,673,684 B1 * | 1/2004 | Huang et al. | 438/299 |
| 6,841,341 B2 * | 1/2005 | Fairbairn et al. | 430/323 |
| 6,884,733 B1 * | 4/2005 | Dakshina-Murthy et al. | 438/717 |
| 2004/0180205 A1 * | 9/2004 | Scarsbrook et al. | 428/408 |
| 2004/0182308 A1 * | 9/2004 | Scarsbrook et al. | 117/68 |

FOREIGN PATENT DOCUMENTS

| | | |
|---|---|---|
| DE | 195 04 434 C1 | 2/1995 |
| DE | 19 04 311 A1 | 1/1999 |
| DE | 19941 148 A1 | 8/1999 |
| DE | 199 44 012 A1 | 9/1999 |
| DE | 199 45 425 A1 | 9/1999 |
| DE | 199 58904 A1 | 12/1999 |
| EP | 0 395 917 | 4/1990 |
| EP | 1 271 546 A2 | 1/2003 |
| WO | WO 96/24887 | 8/1996 |

* cited by examiner

PHOTOLITHOGRAPHIC PATTERNING PROCESS USING A CARBON HARD MASK LAYER OF DIAMOND-LIKE HARDNESS PRODUCED BY A PLASMA-ENHANCED DEPOSITION PROCESS

CLAIM FOR PRIORITY

This application claims priority to International Application No. PCT/DE02/04034, which was published in the German language on May 8, 2003, which claims the benefit of priority to German Application No. 101 53 310.1, which was filed in the German language on Oct. 29, 2001.

TECHNICAL FIELD OF THE INVENTION

The present invention relates to the field of patterning processes for semiconductor technology, and in particular, in which a layer at the surface of a substrate is to be patterned.

BACKGROUND OF THE INVENTION

The production of semiconductor components often entails the requirement that in one process step patterning by etching must be carried out, in which the sections to be removed are formed at least in part by silicon oxide or silicon nitride. One example of this is the fabrication of semiconductor memory cells which have a trench capacitor and a select transistor. Whereas the trench capacitor on one side is electrically connected to the select transistor by a buried strap, on the other side of the trench capacitor an insulation region (STI, shallow trench isolation) is produced, by means of which the trench capacitor is electrically insulated from an adjacent memory cell. The STI insulation region is produced by means of a patterning step in which a surface section formed by a partial section of the trench capacitor previously produced is removed. This means that not only silicon but also silicon oxide has to be etched, since the trench capacitor in its upper section has an insulation collar of silicon oxide. Since there is generally a silicon nitride layer at the surface of the section to be removed, it is therefore necessary for it to be possible for the etching process to etch silicon nitride as well.

With regard to the production of STI insulation regions during the fabrication of the memory cells, reference is made, by way of example, to the German laid-open specifications DE 199 41 148 A1 and DE 199 44 012 A1.

In view of the lateral dimensions of the trench capacitor, which are of the order of magnitude of 100-200 nm, the said process for producing the STI insulation region imposes extremely high demands on the positional accuracy, dimensional stability and flank steepness of the etching process to be employed, since the flank which is to be produced for the recess to be etched has to be located within the trench capacitor on the side remote from the buried strap with an extremely low lateral positioning inaccuracy.

To produce ultra small structures on the semiconductor surface and also to maintain extremely low variations in the feature sizes over the chip, the wafer or the batch, it is necessary for the reflection of light of the exposure wavelength at the wafer surface (photoresist—substrate interface) to be suppressed as completely as possible in order to eliminate disruptive interference effects. This applies in particular to exposure wavelengths at and below 248 nm (193 nm, 157 nm) on account of the increasing reflectivity of the substrates. Furthermore, to obtain the maximum possible depth of focus during the exposure, the resist layer which is to be exposed must firstly be as thin as possible.

However, in order for the pattern to be transferred, in particular in the case of contact holes, a sufficient mask thickness and/or a high etching resistance of the mask (mask selectivity) matched to the layer thickness to be etched is required.

This problem can be countered by means of the following processes which are known from the prior art and are all based on the use of an additional auxiliary layer.

EP 0 492 253 A1 describes a photopatterning process in which two photoresist layers are used. An upper, relatively thin photoresist layer (top resist), after patterning with a silicon-containing agent, is made resistant to dry etching in the oxygen plasma. In this subsequent dry-etching step, the pattern of the top resist is transferred, with the precise dimension of the mask used for the patterning and with vertical flanks, into a lower, relatively thick photoresist layer (bottom resist). On account of the chemical amplification of the patterned top resist, this process has become known as CARL (chemical amplification of resist lines). During the etching of the substrate, the bottom resist serves as the actual mask. The bottom resist itself then has to be removed in a special etching process, for example using $O_2$ or $SO_2$. In particular during the etching of contact holes with a very high aspect ratio, photoresist masks of this type have the significant drawback that it is not possible to control the polymers formed from the resist during the etch. This can lead to a considerable reduction in the etching process window for very small structures.

Furthermore, there are known processes in which the auxiliary layer used is what is known as a hard mask. In German patent DE 195 04 434 C1, a photoresist layer on a mask layer made from a silicon-containing dielectric is exposed in accordance with a predetermined pattern and patterned using solvent. The photoresist layer is used to transfer the pattern to the mask layer, using a modified anisotropic plasma etching process in which the chemical component of the etch is dominant. Then, the photoresist is removed and the patterned mask layer can be used as a mask for a dry etching process for patterning the substrate. Furthermore, similar processes are known, in which hard masks made from polysilicon are used. The polysilicon hard mask layer is in this case deposited in a furnace process at temperatures of between 600° C. and 700° C., which can give rise to problems as a result of the thermal load imposed on the circuit structures which have already been produced. One general problem of the hard mask materials which have just been referred to is that they have to be opened up in a dedicated etching step. A further drawback is that they are not generally suitable—as in the example of polysilicon—for use as antireflection coatings.

Hitherto, antireflection organic layers have been disclosed, which are applied to the surface of the wafer by spin-on processes prior to the actual coating with the photoresist to be exposed using a track. However, these layers cannot be used as hard mask layers, and the reflection can only be reduced to approx. 10%. Furthermore, inorganic oxynitrides which are applied using a CVD process are known for use as antireflection layers, but the reflection cannot be reduced to below 10%. At least for use in oxide etching processes, these layers are likewise not suitable for use as hard mask layers.

Furthermore, it is known from documents U.S. Pat. Nos. 5,378,316, 5,656,128 and EP 0 808 481 B1 to use a hard-mask layer formed from carbon to produce patterns by photolithography. In these documents, it is proposed that the carbon hard mask layer be deposited by a PECVD (plasma enhanced chemical vapor deposition) process, so that hydrogen can be deliberately incorporated into the carbon layer. In this process, it is customary to set pressures of approx. 1-10 Torr of the plasma in the reactor chamber and substrate temperatures of around 400° C. The PECVD deposition gives rise to a highly compacted antireflection coating which already has very good properties as a hard mask and the reflective indices of which can be set by means of the process. This allows a balance to be achieved between optical performance and etching resistance. Production of the carbon hard mask layer by means of the PECVD process gives good results, provided that the deposition can be performed on planar patterns. However, if the deposition has to take place on a topographic pattern which has holes, trenches or elevations, the PECVD process has the drawback that the carbon layer cannot be optimally introduced into the trenches and holes and also does not have a planarizing action. A further drawback is that in general the hard mask quality of the carbon hard mask layer increases with increasing hardness, i.e. an increasing diamond fraction, in the layer and with a decrease in hydrogen content, but the two criteria can only be realized to a limited extent using the PECVD process. For example, the diamond content of the layers deposited by PECVD is virtually zero and the hydrogen content cannot be reduced to below 15%.

Moreover, it is known from the above-cited U.S. Pat. No. 5,378,316 to pattern the carbon hard mask layer not directly by means of the photoresist, but rather by means of an interlayer made from $SiO_2$. This has the advantage that the photoresist layer can be made thinner, so that it is possible to obtain a greater degree of freedom when setting the process conditions of the lithography used in the patterning of the photoresist.

U.S. Pat. No. 5,981,398 describes a patterning process with a chlorine-containing plasma using a hard mask. The hard mask material described is, inter alia, an amorphous carbon layer which is produced by a HDP (high density plasma) CVD process. The etching processes described in this document serve to produce and pattern electrically conductive materials, in particular (Al) interconnect materials. However, there is no more accurate description of how the process is to be managed to ensure that a carbon hard mask layer of high quality can be achieved.

SUMMARY OF THE INVENTION

The invention provides an improved process for producing a carbon hard mask layer, by means of which the layer can be deposited on any desired topography, and the layer properties can be set more successfully between optimum antireflection properties and optimum etching resistance properties.

One advantage of the invention lies in depositing the carbon hard mask layer by means of a plasma enhanced deposition process and carrying out the deposition in such a manner that the carbon hard mask layer, in at least one layer thickness section, has a hardness comparable to that of diamond.

In this context, it is possible to provide for the layer thickness section to extend over the entire carbon hard mask layer and therefore for the carbon hard mask layer to have optimum diamond-like hardness properties and etching resistance properties over its entire thickness. However, it is also possible for the layer to have a diamond-like hardness in only a limited layer thickness section and to have a different hardness in the remaining layer thickness sections.

Where the following text makes frequent mention of the term "diamond-like" or "graphite-like", these terms do not necessarily relate to the structure of the layer applied. Even if the layer is applied with a diamond-like hardness, the crystal structure may and generally will be an amorphous carbon structure.

During the production of the diamond-like layer thickness section, the parameters used for the deposition can be set in such a manner that graphite-like regions which are formed are removed again in situ by means of subsequent etching processes, and that diamond-like regions which are formed are retained. Parameters of this nature which enhance the etching processes include, for example, the supply of ionizable gases, such as argon and/or neon, into the reactor chamber, which brings about additional ion bombardment during the deposition. A further parameter which promotes the etching processes is the hydrogen content in the gas phase.

These parameters can be varied during the layer growth, so that the properties of the carbon hard mask layer formed can be varied over its layer thickness.

The patterning process can be carried out such that a carbon hard mask layer as indicated is applied to the substrate to be patterned, and then a photoresist layer is applied to the carbon hard mask layer. After the exposure and developing of the photoresist layer in order to produce a predetermined pattern, this pattern is transferred to the carbon hard mask layer. The carbon hard mask layer then serves as the actual etching mask for etching of the substrate.

It is also possible for the carbon hard mask layer to be patterned using an etching-resistant interlayer which may be formed, for example, by a silicon oxynitride layer.

The deposition process used may advantageously be what is known as a HDP (high density plasma) deposition process. This proves advantageous in particular if the carbon hard mask layer is to be produced on a topographic pattern, since in particular if this deposition process is selected the carbon can be introduced into holes and trenches especially successfully with an absence of voids.

The HDP deposition can, for example, be carried out at pressures of approx. 1-200 mTorr, and the substrate temperature can be controlled in a range between 200° C.-750° C., preferably 600° C.-750° C.

Otherwise, the details given in DE 199 04 311 A1 apply to the HDP process, and this document is hereby incorporated by reference in the content of disclosure of the present application. A HDP reactor for producing a high-density plasma comprises a central chamber, in which semiconductor or insulator substrates rest on a boat which has no adverse effect on the substrates and does not introduce any impurities into the substrates. The central chamber includes a material which is able to withstand pressures of around 1 mTorr or below, releases minimal amounts of gases at such pressures and does not give rise to any impurities which penetrate into the interior of the chamber or into the substrates or into a thin film which is present thereon. The central chamber works at an operating pressure which is much lower than in the case of standard chambers for chemical vapor deposition or plasma enhanced chemical vapor deposition. The pressure inside the chamber is preferably approximately 5 mTorr, whereas a pressure of approximately 2 Torr is typically used in plasma enhanced chemical vapor deposition. The plasma density within the chamber is much higher than in the case of normal chemical vapor deposition, even plasma enhanced chemical vapor deposition, and is preferably over $10^{16}$ ions/$m^3$, preferably in the range from $10^{16}$ to $10^{22}$ and in particular in the range from $10^{17}$ to $10^{19}$ ions/m$^3$. However, the plasma density could even be still higher. By contrast, at the typical operating pressure of a chamber for plasma enhanced chemical vapor deposition, the plasma density is in the range from $10^{14}$ to $10^{16}$ ions/m$^3$.

In one embodiment of the process according to the invention, an ion sputtering etch is superimposed on the deposition of material. The contribution of this ion sputtering etch should be sufficient for a growth selection process to develop, as has already been indicated. For this purpose, the layer can be sputtered with Ar ions, Ne ions or other ions. Suitable carbon precursors include gases such as $CH_4$, $CH_2H_6$, $C_2H_4$, $C_2H_2$ and $C_3H_6$. The addition of relatively large quantities of hydrogen is also advantageous for the layer formation. With increasing ion bombardment and increasing hydrogen content in the gas phase, the carbon layers produced become harder, since both parameters entail etching of the graphite-like fractions in the carbon layer, while the diamond fractions which are simultaneously present are not etched back, since they are more resistant to this attack. The layer formed in this way is more resistant to ion etching processes and consequently results in a hard mask of higher quality. At the same time, the simultaneous deposition-sputtering process allows filling of trenches or holes on structured surfaces. The carbon layer produced by the HDP process has a lower hydrogen content than the carbon layer deposited by the PECVD process. In particular, by suitable setting of the parameters, it is possible to reduce the hydrogen content to below 5%. The carbon layer fills up ultra small structures with diameters of less than 100 nm without any voids and is able to planarize topographies.

Both the ion bombardment and the substrate temperature can be deliberately varied during the deposition. This allows the formation of what are known as gradient layers, i.e. the optical properties and also the mechanical properties can be varied over the depth of the layer. As a result, optimum antireflection coatings are produced, since a change in the reflective index over the depth of the layer means a maximum reduction in reflection. At the same time, the process can be configured to be such that the hardness is greater, for example, in the bottom layer regions than at the layer surface. This allows optimum process management during the subsequent dry etching process.

If appropriate, the deposition process selected may also be a PECVD (plasma enhanced chemical vapor deposition) process. A precondition in this case is that that electrode of the parallel plate reactor customarily used on which the substrates are arranged is connected as cathode. In this case, part of the growing layer is sputtered away again by the ions. In order, according to the invention, to bring about a growth selection process, it is possible, as in the HDP deposition process, to supply increased amounts of elements such as argon, neon, inter alia to the reactor in order to form corresponding ions.

If desired, the process described using a carbon hard mask layer can also be combined with the CARL process described in the introduction, in which chemical amplification of the resist lines of the photoresist layer is brought about. This chemical amplification may, for example, be effected by wet-chemical silylation, i.e. the attachment of silyl groups to the organic resist material, as has been described, for example, in documents DE 42 26 464, EP 0 395 917 or U.S. Pat. No. 5,234,793.

The process according to the invention is suitable in particular for the production of the trench isolation which has already been described in the introduction as part of the fabrication of memory cells with trench capacitor and select transistor by what is known as the AA (active area) process. For this process, currently a borosilicate hard mask is used as etching mask, which is by no means an optimum solution, for various reasons.

BRIEF DESCRIPTION OF THE DRAWINGS

The text which follows provides a more detailed explanation of exemplary embodiments for carrying out the process according to the invention in conjunction with the figures of the drawings, in which.

DETAILED DESCRIPTION OF THE INVENTION

Figure 1A:
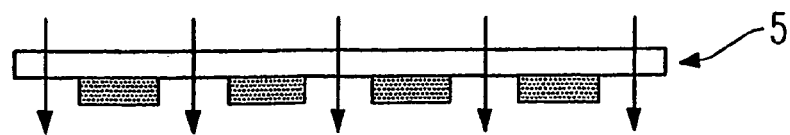
FIGS. 1A-F show various stages involved in the patterning of a substrate according to a first embodiment of the process according to the invention using chemical resist amplification.

In accordance with FIG. 1A, a substrate 1 which is to be patterned is provided, which substrate may, for example, be a chip or wafer into which a matrix-like arrangement of trench capacitors has already been processed, these trench capacitors each belonging to memory cells. The patterning process illustrated in the following text by way of example is intended to produce insulation regions (STI) between the trench capacitors. Since the sections which are to be removed in order to produce the insulation regions also in each case include partial sections of the processed trench capacitors, accordingly it is also necessary to etch silicon oxide, since the trench capacitors generally have an insulation collar including silicon oxide.

A carbon hard mask layer 2 is applied to the substrate 1 which has undergone preliminary processing of this nature. As described, the production of the carbon hard mask layer 2 is effected by a plasma enhanced deposition process. In the specific application mentioned involving the provision of insulation regions, there is generally a topographic pattern, in which case it is advantageous to select an HDP process for the deposition of the carbon hard mask layer 2, so that the carbon is introduced into the trenches and holes which are present without leaving any voids. The thickness of the carbon hard mask layer 2 is in the range from 50-300 nm.

Furthermore, the process according to the invention makes it possible for the carbon hard mask layer 2 to be produced with optimum properties which are dependent on the layer thickness and are matched to the particular process. The hard mask layer 2 may, for example, be designed as a gradient layer, in such a manner that it has a diamond-like structure in a lower layer thickness section, whereas in an upper layer thickness section it has optimum antireflection properties. The latter may possibly require the pattern not to have a diamond-like structure, but rather more of a graphite-like structure with a set, higher hydrogen content. The major advantage of the HDP process compared to the PECVD process resides in the fact that it is easier to vary the parameters which determine the structure of the layer to be deposited during the layer deposition. If a transition from amorphous, graphite-like structure to a diamond-like structure is to be produced, by way of example it is merely necessary to increase the level of hydrogen supplied and/or the level of additional ionizable gases, such as argon and neon, to a certain value. The etching processes which then increase mean that the structure can no longer grow in graphite-like form, and consequently only the diamond-like structures that are formed are retained.

Figure 1B:
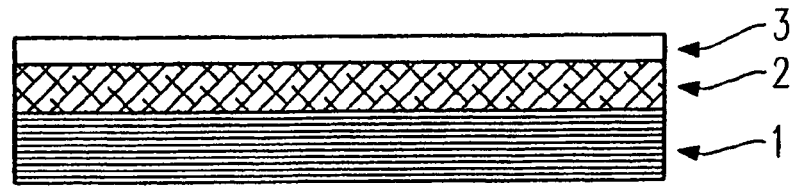

Then, a layer 3 of a positive photoresist is deposited on the structure which has been produced. This photoresist layer 3 is then exposed by conventional exposure by means of a chrome mask 5, and then the exposed regions are removed, so that resist regions 3A remain in place on the carbon/hard mask layer 2. The result is illustrated in FIG. 1B.

Figure 1C:
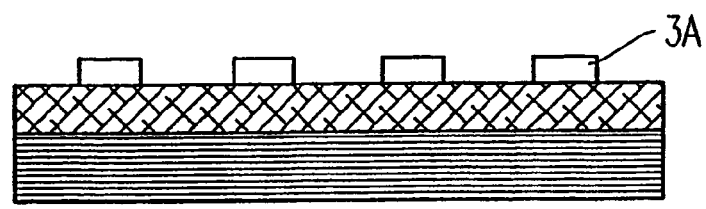

Then, a chemical amplification of the resist regions 3A is carried out by wet-chemical silylation, in which silyl groups attach themselves to the organic material of the photoresist regions 3A, so that amplification regions 4A of silyl groups are formed around the resist regions 3A. The result is illustrated in FIG. 1C.

Figure 1D:
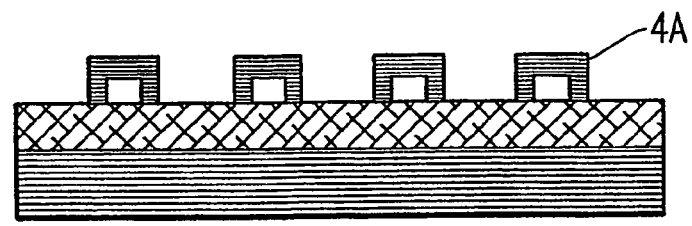

Next, the carbon hard mask layer 2 is opened up, for example by means of an anisotropic dry etching process using an $O_2$ plasma, during which the amplified resist regions 3A act as an etching mask. The etch is initially carried out down to the surface of the substrate 1. Below the amplified resist regions 3A, this etching step forms mask regions 2A of the carbon hard mask layer, which serve as an etching hard mask for the subsequent etching step on the substrate 1. The result is illustrated in FIG. 1D.

Then, the actual patterning process of the substrate 1 is carried out by an anisotropic dry etching step, in which the mask regions 2A serve as the etching hard mask. The dry etching step may, for example, be carried out using an $O_2$ plasma. Unetched substrate regions 1A remain beneath the mask regions 2A, and in these unetched substrate regions 1A, by way of example in the abovementioned application of the production of insulation regions, fully processed trench capacitors and select transistors of memory cells may be arranged. The result is illustrated in FIG. 1E.

Finally, the mask regions 2A can be removed by means of a simple stripping process using an $O_2$ plasma. The substrate 1 which has been patterned in the form of the substrate regions 1A is illustrated in FIG. 1F.

To produce insulation regions, the uncovered regions have to be filled with a suitable insulation material in a subsequent process step which is not illustrated.

Figure 1E:
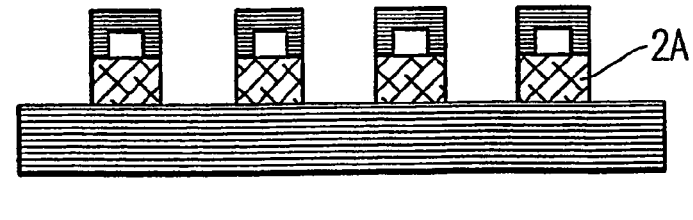
Figure 1F:
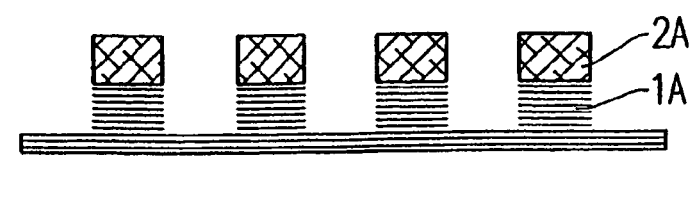

The process steps illustrated in FIG. 1D-F may, if appropriate, be carried out in succession in a single reaction chamber.

Figure 2A:
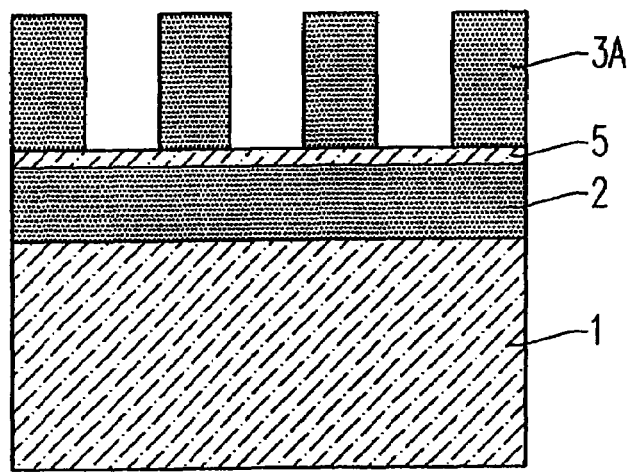
FIGS. 2A-E show various stages involved in the patterning of a substrate in accordance with a second embodiment of the process according to the invention using an etching-resistant interlayer.

In accordance with FIG. 2A, a carbon hard mask layer 2 is deposited on a substrate 1 to be patterned using a plasma enhanced deposition process according to the invention. Then, an etching-resistant interlayer 5, which may be formed, for example, by an approx. 25 nm thick silicon oxynitride (SiON), is applied to the carbon hard mask layer 2, for example by means of a PECVD process. The interlayer 5 must have a sufficient etching resistance during the etching of the carbon hard mask layer 2. Then, 20 the photoresist layer is applied to the interlayer 5 and patterned, so that masked regions 3A remain in place.

Figure 2B:
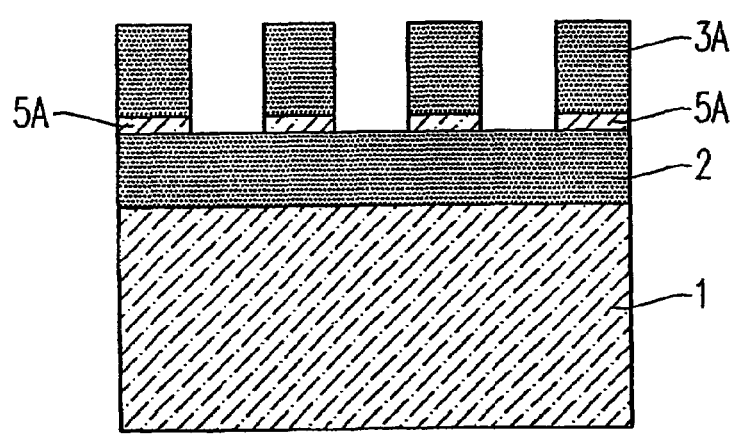

Then, in accordance with FIG. 2B, the pattern of the photoresist layer is transferred to the interlayer 5, so that masked regions 5A of the interlayer 5 result below the masked regions 3A of the photoresist layer. The SiON layer 5 can be etched in a dry etching process using etching gases such as Ar, $CHF_3$, $CF_4$ or the like, for example in a MERIE reactor. ICP, ECR or other plasma etching reactors are also conceivable.

Figure 2C:
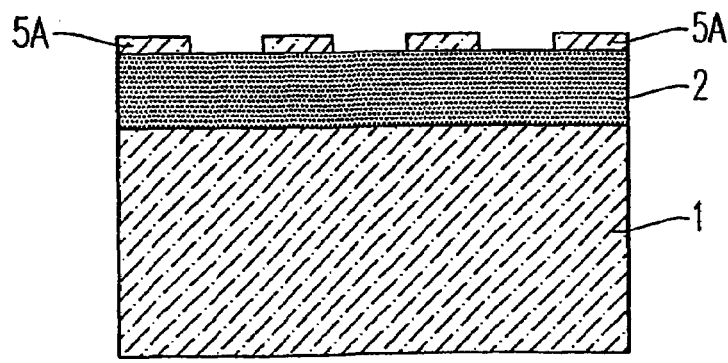

In accordance with FIG. 2C, the masked photoresist regions 3A are removed in a standard resist incinerator.

Figure 2D:
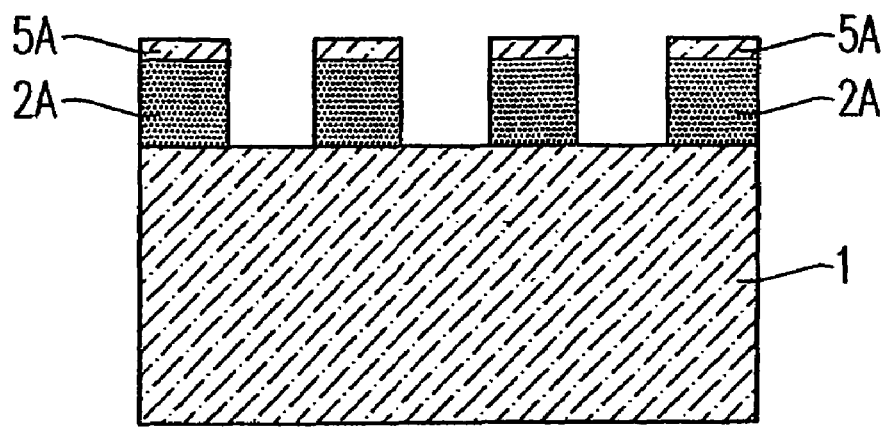
Figure 2E:
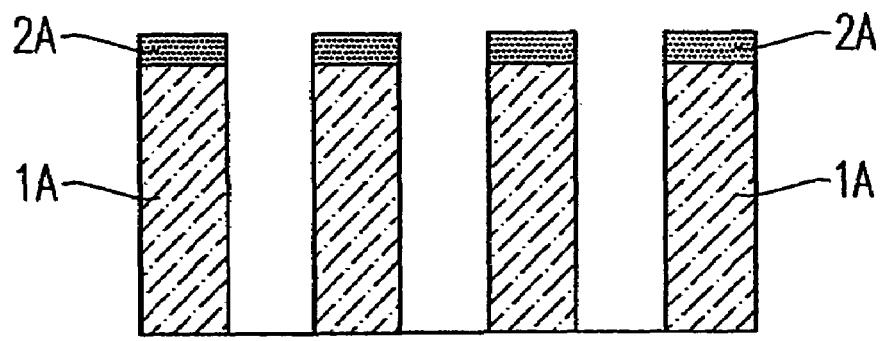

Then, in accordance with FIG. 2D, the carbon hard mask layer 2 is patterned, so that masked regions 2A are formed beneath the masked SiON regions 5A.

This may preferably be carried out in a dry etching process in a MERIE reactor using $O_2$ and/or $N_2$ etching media. This etch can be carried out with a high selectivity with respect to the masked SiON regions 5A. In this case, it is also possible for the photoresist to be removed in situ, thereby eliminating the need for the intermediate step shown in FIG. 2C using the standard resist incinerator.

Then, as has already been described in conjunction with FIG. 1, the substrate 1 is patterned by means of the masked carbon hard mask regions 2A, so that patterned substrate regions 1A are formed.

What is claimed is:

1. A process for photolithographic production of patterns in a substrate, comprising:
    applying a carbon hard mask layer to the substrate by a plasma-enhanced deposition process, the deposition being carried out such that the carbon hard mask layer, in at least one layer thickness section, has a hardness comparable to that of diamond;
    patterning the carbon hard mask layer; and
    transferring the pattern of the carbon hard mask layer to the substrate, wherein
    in the applying process, the plasma-enhanced deposition process is a high density plasma deposition process, one or more of the gases $CH_4$, $C_2H_6$, $C_2H_4$, $C_2H_2$ and $C_3H_6$ are used as carbon precursors, and hydrogen and one or both of the gases argon and neon are supplied, wherein during the production of the diamond-like layer thickness section, the content of the supplied hydrogen and the other parameters used for deposition are set such that hydrogen content in the produced carbon hard mask layer is below 5%.

2. The process as claimed in claim 1, wherein ion bombardment is brought about during the deposition through an introduction of Ar and/or Ne, and/or high levels of hydrogen are supplied.

3. The process as claimed in claim 1, wherein a substrate temperature of from 200° C.-750° C. is set during the production of the diamond-like layer thickness section.

4. The process as claimed in claim 1, wherein the applying includes a PECVD deposition process.

5. The process as claimed in claim 1, wherein the patterning includes
    applying a photoresist layer to the carbon hard mask layer, which is patterned by photolithography and the pattern is transferred to the carbon hard mask layer.

6. The process as claimed in claim 5, further comprising:
    introducing an interlayer between the carbon hard mask layer and the photoresist layer, and transferring the pattern produced in the photoresist layer to the interlayer and is then
    transferred to the carbon hard mask layer.

7. The process as claimed in claim 5, wherein the photoresist layer is chemically amplified after it has been patterned.

8. The process as claimed in claim 1, wherein the carbon hard mask layer is formed as a gradient layer.

9. The process as claimed in claim 8, wherein the applying is carried out such that the composition and/or the pattern of the carbon hard mask layer varies as a function of its depth.

10. A process for producing insulation regions between components formed in a substrate, comprising:
    applying a carbon hard mask layer to the substrate by a plasma-enhanced deposition process, the deposition being carried out such that the carbon hard mask layer, in at least one layer thickness section, has a hardness comparable to that of diamond;

patterning the carbon hard mask layer; and transferring the pattern of the carbon hard mask layer to the substrate, wherein in the applying process, the plasma-enhanced deposition process is a high density plasma deposition process, one or more of the gases $CH_4$, $C_2H_6$, $C_2H_4$, $C_2H_2$ and $C_3H_6$ are used as carbon precursors, and hydrogen and one or both of the gases argon and neon are supplied, wherein during the production of the diamond-like layer thickness section, the content of the supplied hydrogen and the other parameters used for deposition are set such that hydrogen content in the produced carbon hard mask layer is below 5%; and filling the removed regions with an insulating material.

* * * * *